(12) United States Patent
Enloe

(10) Patent No.: US 6,803,159 B2
(45) Date of Patent: Oct. 12, 2004

(54) METHOD OF KEEPING CONTAMINANTS AWAY FROM A MASK WITH ELECTROSTATIC FORCES

(75) Inventor: Dan Enloe, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 161 days.

(21) Appl. No.: 10/112,454

(22) Filed: Mar. 28, 2002

(65) Prior Publication Data
US 2003/0186131 A1 Oct. 2, 2003

(51) Int. Cl.[7] .............................. G03F 9/00; A47G 1/12
(52) U.S. Cl. ............................................. 430/5; 428/14
(58) Field of Search ........................... 430/5; 428/14; 382/144

(56) References Cited

U.S. PATENT DOCUMENTS 6,492,067 B1 * 12/2002 Klebanoff et al. ............. 430/5
6,569,576 B1 * 5/2003 Hsueh et al. ................... 430/5
6,642,531 B1 * 11/2003 Powers ...................... 250/492.2

* cited by examiner

Primary Examiner—Saleha R. Mohamedulla
(74) Attorney, Agent, or Firm—Glen B. Choi

(57) ABSTRACT

The present invention describes an apparatus comprising a mask; a pellicle spacer, the pellicle spacer attached to the mask; and an electrostatic pellicle system, the electrostatic pellicle system attached to the pellicle spacer.

The present invention further describes a method of keeping contaminants away from a vicinity of a mask during exposure, the contaminants including an uncharged or neutral particle, a positively-charged particle, or a negatively-charged particle, comprising: inducing a positive or negative charge on the uncharged or neutral particle; attracting the positively-charged particle with a negatively-charged electric field; and attracting the negatively-charged particle with a positively-charged electric field.

4 Claims, 3 Drawing Sheets

METHOD OF KEEPING CONTAMINANTS AWAY FROM A MASK WITH ELECTROSTATIC FORCES

FIELD OF THE INVENTION

The present invention relates generally to the field of semiconductor integrated circuit (IC) manufacturing, and, more specifically, to an apparatus for and a method of keeping contaminants away from the vicinity of a mask during exposure.

BACKGROUND OF THE INVENTION

The manufacturing of IC devices involves the sequential processing of a semiconductor wafer to add or remove various layers of materials. The critical layers define features in the IC devices that possess tighter groundrules, such as those for isolation, gate, contact, and first metal, while the non-critical layers define the remaining features.

The process of photolithography is performed to pattern the layers on the wafer. Initially, the wafer is covered with photoresist or other material that is sensitive to light energy. Then, an imaging tool, such as a stepper, aligns the wafer and a mask prior to projecting light energy onto the mask. The light energy is subsequently transmitted or reflected to print a latent image in the photoresist on the wafer. After printing the same image in contiguous fields across the wafer, the photoresist on the wafer is developed to create openings that correspond to the placement and intensity of the light energy. The image transfer to the wafer may further involve the processes of etch or ion implantation. For example, the photoresist may act as a stencil for transferring a pattern from the mask into a topographical structure or a dopant profile.

Contaminants must be kept away from the vicinity of a mask during exposure in order to ensure fidelity of the pattern transfer. The features on a mask may be kept clean by covering with a pellicle. The pellicle is a thin, yet robust, layer of a material that is transparent to the exposure light energy.

A shorter wavelength may be selected for the exposure light in order to print a smaller critical dimension (CD). However, very few materials are sufficiently transparent or durable when exposed to light energy having a wavelength of less than about 180 nm.

Thus, what is needed is an apparatus for and a method of keeping contaminants away from the vicinity of a mask during exposure.

BRIEF DESCRIPTION OF THE DRAWINGS

The present invention is illustrated, by way of example and not limitation, in the figures of the accompanying drawings, in which.

DETAILED DESCRIPTION OF THE PRESENT INVENTION

In the following description, numerous particular details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Contamination must be kept away from a path of exposure radiation in an exposure tool, such as a stepper, to ensure fidelity of a pattern transfer from a mask to a photoresist coated on a wafer. The mask may be transmissive or reflective. The path of exposure radiation in the stepper includes a vicinity of the mask. The present invention comprises an apparatus for and a method of keeping contamination away from the vicinity of the mask during exposure. The apparatus may include an electrostatic pellicle system for attracting contaminants. The method may include charging up wires in the vicinity of the mask, such as in the path of the exposure radiation, to attract contaminants.

Figure 1A:
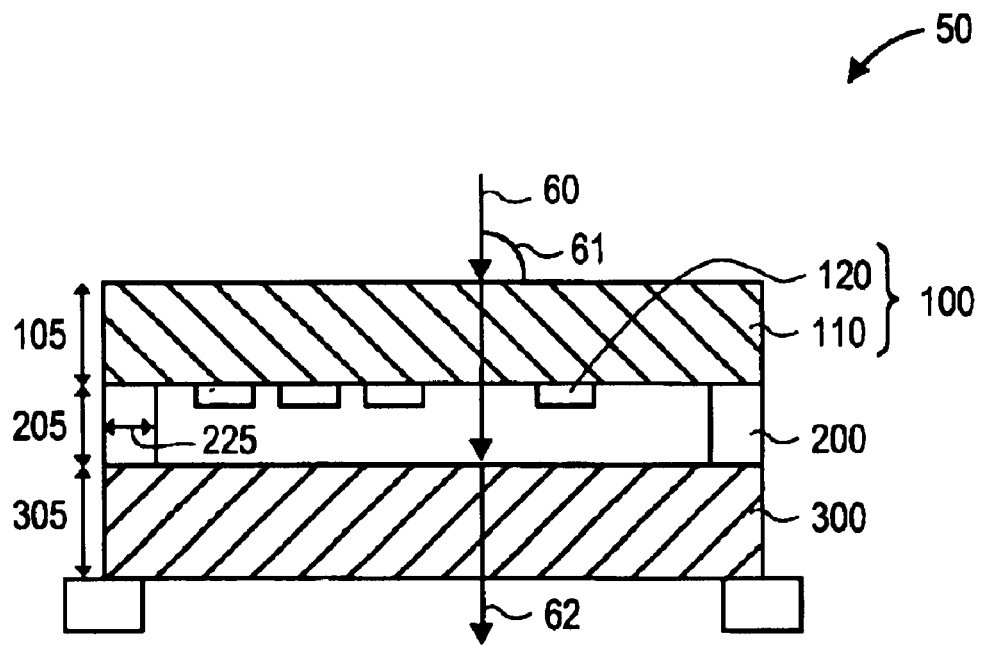
FIG. 1(a) is an illustration of an elevation view of an embodiment of a transmissive mask assembly according to the present invention.

Several embodiments of the apparatus claimed in the present invention will be described first. An elevation view of an embodiment of a transmissive mask assembly 50 according to the present invention is shown in FIG. 1(a). The transmissive mask assembly 50 includes a transmissive mask 100, a pellicle spacer 200, and an electrostatic pellicle system 300. The electrostatic pellicle system 300 must possess sufficient mechanical strength and durability to withstand the absolute and differential pressures associated with any purging or scanning of the transmissive mask assembly 50 that may occur.

In one embodiment, the exposure radiation 60 is deep ultraviolet (DUV) light that is incident on the transmissive mask assembly 50 at an angle 61 of about 90.0 degrees. DUV light may have a nominal wavelength of about 248 nanometers (nm), 193 nm, or 157 nm. The exposure radiation 60 is mostly transmitted, with a small portion being reflected and very little being absorbed. Exposure radiation 62 emerges from the transmissive mask assembly 50.

In one embodiment, the transmissive mask 100 may have an essentially rectangular or square shape with lateral dimensions of about 152.4 millimeters (mm) by about 152.4 mm square with a thickness 105 of about 6.35 mm. The transmissive mask 100 may include an opaque layer 120 located over a surface of a transparent substrate 110.

The optical density (OD) of the opaque layer 120 should be sufficiently high, such as 3.0, to prevent transmission of the exposure radiation 60. The opaque layer 120 may include a material such as chrome. The chrome may have a thickness of about 800.0–2,500.0 Angstroms. A thicker layer is usually required for a shorter wavelength. The opaque layer 120 may include other materials, such as oxygen or nitrogen, especially towards the upper or lower surfaces of the opaque layer 120. The other materials may serve to improve adhesion, reduce reflectivity, or minimize surface roughness. Features are patterned into the opaque layer 120.

The transparent substrate 110 may include modified fused silica (MFS). In one embodiment, MFS includes fused silica (FS), such as quartz or silicon oxide, having Fluorine doping. In another embodiment, MFS includes FS having reduced hydroxyl (—OH) content. In still another embodiment, the transparent substrate 110 may include other materials, usually crystalline, such as calcium fluoride, magnesium fluoride, barium fluoride, or lithium fluoride. Choice of the material may depend on the stringency of requirements to maximize transparency, durability, and robustness while minimizing birefringence, coefficient of thermal expansion (CTE), stress, and cost. In some cases, CTE of the transparent substrate 110 should be matched with CTE of other portions of the transmissive mask assembly 50.

The pellicle spacer 200 separates the transmissive mask 100 from the electrostatic pellicle system 300 with a stand-off distance 205. The stand-off distance 205 may be about 1.0–6.0 mm. In one embodiment, the pellicle spacer 200 may include a metal, such as Aluminum.

The pellicle spacer 200 may be attached towards the periphery of the transmissive mask 100 and the electrostatic pellicle system 300. The pellicle spacer 200 may have a width 225 of about 1.0–6.0 mm. The attachment may include an appropriate adhesive.

Distortion of either the transmissive mask 100 or the electrostatic pellicle system 300 must be minimized. Distortion may be mechanically induced, such as by inappropriate choice or application of the adhesive for attachment. The distortion may also be thermally induced, such as by a mismatch in CTE of the various materials being attached.

In one embodiment, the out-of-plane distortion (OPD) must have a maximum value of less than about 65.0 nm. In another embodiment, the in-plane distortion (IPD) must have a maximum value of less than about +/−4.0 nm.

The exposure radiation 60 may be incident on the transmissive mask assembly 50 with a power of 50.0–875.0 mW/cm$^2$. The extent of any temperature rise from the thermal loading during exposure depends on the net generation of heat. In general, heat may be dissipated through mechanisms of conduction (to materials in intimate contact), convection (by flow of materials in close proximity), and radiation (to direct line-of-sight portions of the surroundings).

Figure 1B:
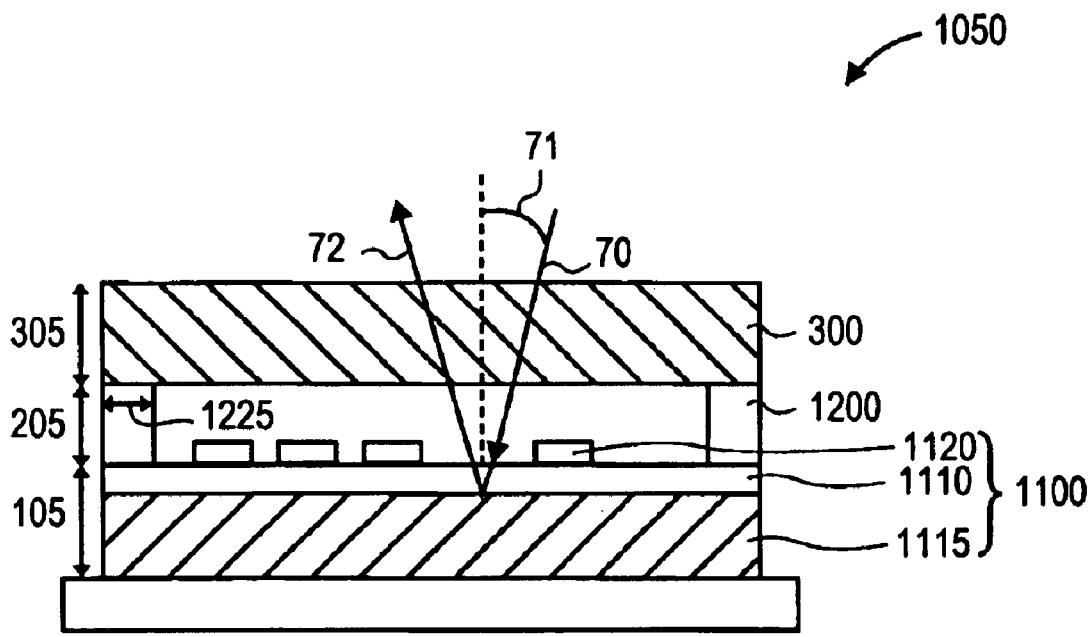
FIG. 1(b) is an illustration of an elevation view of an embodiment of a reflective mask assembly according to the present invention.

An elevation view of an embodiment of a reflective mask assembly 1050 according to the present invention is shown in FIG.1(b). The reflective mask assembly 1050 includes a reflective mask 1100, a pellicle spacer 1200, and an electrostatic pellicle system 300. The electrostatic pellicle system 300 must possess sufficient mechanical strength and durability to withstand the absolute and differential pressures associated with any purging or any scanning of the reflective mask assembly 1050 that may occur.

In one embodiment, the exposure radiation 70 is extreme ultraviolet (EUV) light that is incident on the reflective mask assembly 1050 at an angle 71 of about 83.0–85.0 degrees. Thus, the reflective mask 1100 is not telecentric. EUV light may have a nominal wavelength of about 11.0–15.0 nm. The exposure radiation 70 is mostly reflected, with a small portion being absorbed and very little being transmitted. Exposure radiation 72 emerges from the reflective mask assembly 50.

In one embodiment, the reflective mask 1100 may have an essentially rectangular or square shape with lateral dimensions of about 152.4 mm by about 152.4 mm square with a thickness 1105 of about 6.35 mm. In another embodiment, the thickness 1105 may be about 0.725 mm.

The reflective mask 1100 may include an absorber layer 1120 that is located over a surface of a reflective substrate 1110. The absorber layer 1120 may include one or more materials in elemental, alloy, ceramic, or compound form. A material in elemental form may include a refractive metal. Examples of refractive metals include tantalum, titanium, and tungsten. A material in alloy form may include a combination of two or more metals. A material in ceramic form may include a combination of a metal and a nonmetal. A material in a compound form may include a nitride or an oxide of a metal. In another embodiment, the absorber layer 1120 may be an amorphous material, such as amorphous silicon or amorphous carbon. Features are patterned into the absorber layer 1120.

The reflective substrate 1110 may include a Bragg reflector, especially when the wavelength of the exposure radiation 70 is very short. In one embodiment, the Bragg reflector includes a multilayer. The multilayer may include 40 bilayers, in which each bilayer includes Molybdenum film and Silicon film. The reflective substrate 1110 is located over a surface of a low (coefficient of) thermal expansion (LTE) material 1115.

The LTE material 1115 may include an amorphous silicon oxide that has been doped with titanium oxide. Use of a LTE material 1115 will minimize image displacement error that may result from heat generated by the exposure radiation 70.

The pellicle spacer 1200 separates the reflective mask 1100 from the electrostatic pellicle system 300 with a stand-off distance 205. The stand-off distance 205 may be about 1.0–6.0 mm. In one embodiment, the pellicle spacer 1200 may include a metal, such as Aluminum.

In some cases, the electrostatic pellicle system 300 may be tilted relative to the reflective mask 1100. In one embodiment, the tilt angle is about the same as the incident angle 71 of the exposure radiation 70. In another embodiment, the tilt angle is about half of the incident angle 71 of the exposure radiation. When the tilt angle is not zero, the stand-off distance 1205 between the electrostatic pellicle system 300 and the reflective mask 1100 will be consistent over time, but not the same across the reflective mask assembly 1050.

The pellicle spacer 1200 may be attached towards the periphery of the transmissive mask 100 and the electrostatic pellicle system 300. The pellicle spacer 1200 may have a width 1225 of about 1.0–6.0 mm. The attachment may include an appropriate adhesive.

Distortion of either the reflective mask 1100 or the electrostatic pellicle system 300 must be minimized. Distortion may be mechanically induced, such as by inappropriate choice or application of the adhesive for attachment. The distortion may also be thermally induced, such as by a mismatch in CTE of the various materials being attached.

In one embodiment, the out-of-plane distortion (OPD) must have a maximum value of less than about 35.0 nm. In another embodiment, the in-plane distortion (IPD) must have a maximum value of less than about +/−2.0 nm.

The exposure radiation 70 may be incident on the reflective mask assembly 1050 with a power of 50.0–875.0 mW/cm$^2$. The extent of any temperature rise from the thermal loading during exposure depends on the net generation of heat. In general, heat may be dissipated through mechanisms of conduction (to materials in intimate contact), convection (by flow of materials in close proximity), and radiation (to direct line-of-sight portions of the surroundings).

Figure 2:
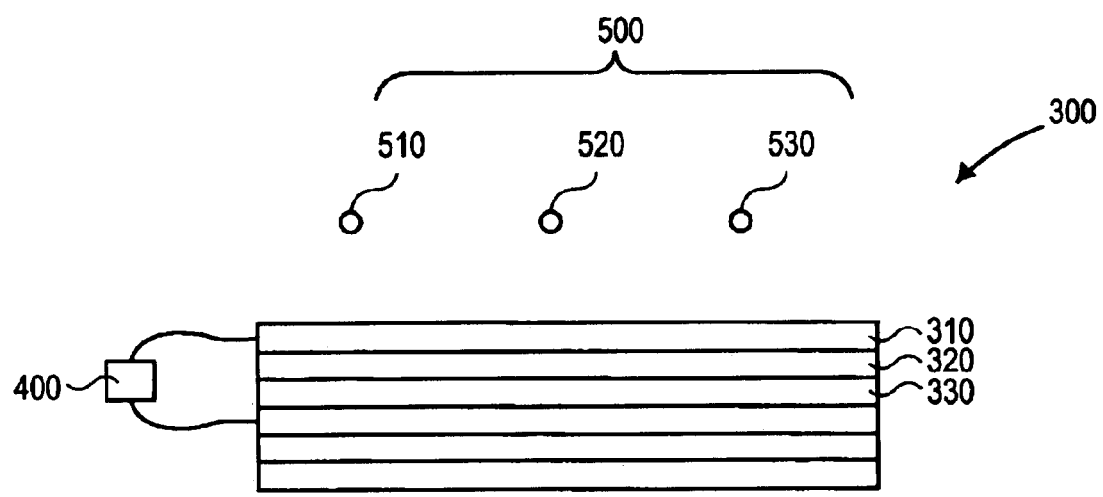
FIG. 2 is an illustration of an elevation view of an embodiment of an electrostatic pellicle system according to the present invention.

The vertical structure of an electrostatic pellicle system 300 may include alternating layers of a discharge array 310 and a collection capture array 330, as shown in an elevation view of an embodiment of the present invention in FIG. 2. Each discharge array 310 is separated from each collection capture array 330 by an insulator array 320. The electrostatic pellicle system 300 should include at least one discharge array 310 and at least one collection capture array 330. The plane of the discharge array 310 and the plane of the collection capture array 330 are usually parallel.

The electrostatic pellicle system 300 may have a different vertical structure depending on whether it is used with a transmissive mask 100 or a reflective mask 1100. First, the exposure radiation 60 used with a transmissive mask 100 makes 1 pass through the electrostatic pellicle system 300 while the exposure radiation 70 used with a reflective mask makes 2 passes through the electrostatic pellicle system 300. Second, the transmissive mask 100 is telecentric while the reflective mask 1100 is non-telecentric.

The electrostatic pellicle system 300 may have a footprint that is about the same as or smaller than the footprint of the transmissive mask 100 or the reflective mask 1100. The electrostatic pellicle system 300 should completely cover the active area of the transmissive mask 100 or the reflective mask 1100. The specific lateral dimensions of the electrostatic pellicle system 300 may depend on the characteristics of the stepper with which the mask is being used. In the case of a stepper that scans a slit to expose photoresist on a wafer, typical stepper parameters include reduction ratio (usually 4×, but may be 5× or 6×), exposure slit height (usually 15–35 mm), exposure slit width (usually 2–8 mm), and exposure slit scanning distance (usually 100–150 mm). The location and size of any barcode should also be considered.

Figure 3A:
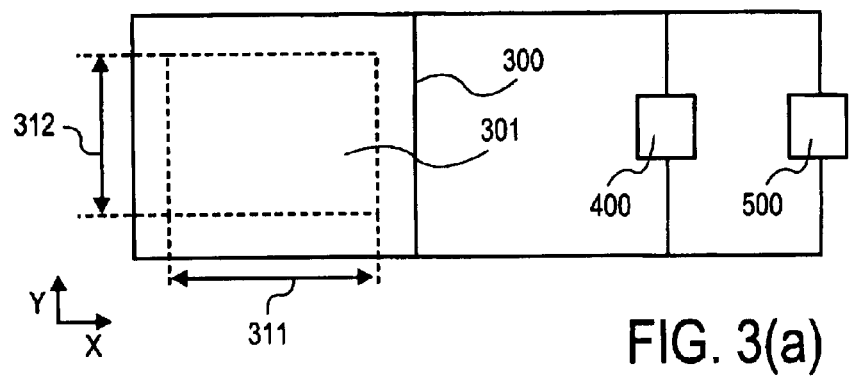
FIGS. 3(a)–(d) are illustrations of plane views of an embodiment of an electrostatic pellicle system according to the present invention.

FIG. 3(a) shows a plane view of an embodiment of the electrostatic pellicle system 300 according to the present invention. The lateral dimensions of an active area 301 include an x-dimension 311 and a y-dimension 312. In the case of a stepper that scans a slit, the x-dimension 311 usually corresponds to the exposure slit height direction while the y-dimension 312 usually corresponds to the exposure slit scanning direction. The x-dimension 311 may be about 100.0–152.0 mm and the y-dimension 312 may be about 128.0–152.0 mm.

Each discharge array 310 in the electrostatic pellicle system 300 may include multiple wires 315 that are connected. In one embodiment, the wires 315 may be predominately oriented parallel to either the x-axis or the y-axis. The x-axis and the y-axis are perpendicular to each other and define the plane of the discharge array 310. The parallel portions of the wires 315 may be separated laterally by a spacing, such as about 2.0 mm.

Figure 3B:
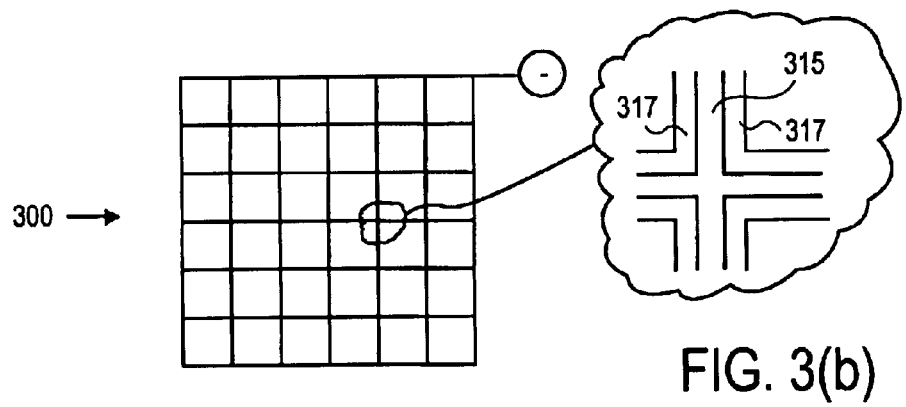

In a plane view of another embodiment of the present invention, as shown in FIG. 3(b), the wires 315 are laid out as a rectilinear grid, with some wires being parallel to the x-axis and other wires being parallel to the y-axis.

The wires 315 in the discharge array 310 of the electrostatic pellicle system 300 may include a metal, such as aluminum or a refractive metal, such as molybdenum. The metal may be deposited by sputtering or chemical vapor deposition (CVD), followed by patterning with photolithography and wet or dry etches. The wires 315 should have a low reflectivity at the wavelength of the exposure radiation 60 or 70. For example, the reflectivity may be about 20.0% at about 193 nm or about 10.0% at about 157 nm. In one embodiment, the wires 315 have a diameter of 1.0 micrometer (um) or less.

The wires 315 in the discharge array 310 may be located over or embedded, partially or completely, within a support material 317 that is transparent at the wavelength of the exposure radiation 60 or 70. The support material 317 should prevent any significant bending, or sagging, of the discharge array 310 due to gravitational forces. The support material 317 should also minimize any significant degradation of the optical characteristics of the exposure radiation 60 or 70. The support material 317 should permit greater than about 85.0% transmission of the exposure radiation 60 or 70, with a non-uniformity of less than about 0.20–0.25%.

In one embodiment, the support material 317 is only present in the vicinity of the wires 315 to provide support and is absent elsewhere. In another embodiment, the support material 317 is present essentially everywhere (not shown) within the active area 301. Placing a transparent support material 317 with a uniform thickness in the path of the exposure radiation 60 or 70 may introduce a defocusing effect and spherical aberration. Spherical aberration will degrade the contrast of the image although compensation may sometimes be provided by the stepper.

If the plane of the support material 317 is globally tilted relative to the incident exposure radiation 60 or 70, an image shift and coma aberration may be introduced. Coma aberration will also degrade the contrast of the image. Bending or sagging of the support material 317 will produce a local, as opposed to a global, tilt. If the support material 317 varies in thickness, the resulting wedge effect will introduce distortion. The wedge effect is also affected by the stand-off distance 205 or 1205.

Each collection capture array 330 in the electrostatic pellicle system 300 may include multiple wires 335 that are connected. In one embodiment, the wires 335 may be predominately oriented parallel to either the x-axis or the y-axis. The x-axis and the y-axis are perpendicular to each other and define the plane of the collection capture array 330. The parallel portions of the wires 335 may be separated laterally by a spacing, such as about 2.0 mm.

In a plane view of another embodiment of the present invention, as shown in FIG. 3(b), the wires 335 are laid out as a rectilinear grid, with some wires being parallel to the x-axis and other wires being parallel to the y-axis.

The wires 335 in the collection capture array 330 of the electrostatic pellicle system 300 may include a metal, such as aluminum or a refractive metal, such as molybdenum. The metal may be deposited by sputtering or chemical vapor deposition (CVD), followed by patterning with photolithography and wet or dry etches. The wires 335 should have a low reflectivity at the wavelength of the exposure radiation 60 or 70. For example, the reflectivity may be about 20.0% at about 193 nm or about 10.0% at about 157 nm. In one embodiment, the wires 335 have a diameter of 1.0 micrometer (um) or less.

The wires 335 in the collection capture array 330 may be located over or embedded, partially or completely, within a support material 337 that is transparent at the wavelength of the exposure radiation 60 or 70. The support material 337 should prevent any significant bending, or sagging, of the discharge array 310 due to gravitational forces. The support material 337 should also minimize any significant degradation of the optical characteristics of the exposure radiation 60 or 70. The support material 337 should permit greater than about 85.0% transmission of the exposure radiation 60 or 70, with a non-uniformity of less than about 0.20–0.25%.

In one embodiment, the support material 337 is only present in the vicinity of the wires 335 to provide support and is absent elsewhere. In another embodiment, the support material 337 is present essentially everywhere (not shown) across the active area 301. Placing a transparent support material 337 with a uniform thickness in the path of the exposure radiation 60 or 70 may introduce a defocusing effect and spherical aberration. Spherical aberration will degrade the contrast of the image although compensation may sometimes be provided by the stepper.

If the plane of the support material 337 is globally tilted relative to the incident exposure radiation 60 or 70, an image shift and coma aberration may be introduced. Coma aberration will also degrade the contrast of the image. Bending or sagging of the support material 337 will produce a local, as opposed to a global, tilt. If the support material 337 varies in thickness, the resulting wedge effect will introduce distortion. The wedge effect is also affected by the stand-off distance 205 or 1205.

In one embodiment, the wires 315 in the discharge array 310 and the wires 335 in the collection capture array 330 that are stacked over each other in the electrostatic pellicle system 300 have similar dimensions and layouts. In another embodiment, the wires 315 in the discharge array 310 and the wires 335 in the collection capture array 330 may differ in dimensions or layouts. The wires 315 in the discharge array 310 and the wires 335 in the collection capture array 330 may be formed from different materials.

Figure 3C:
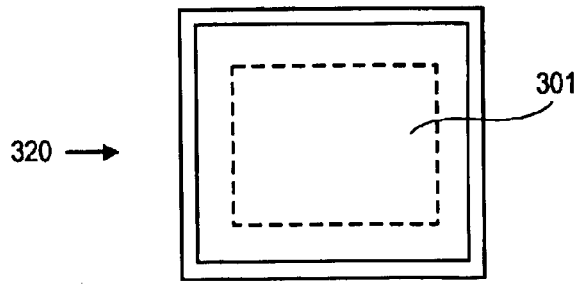
Figure 3D:
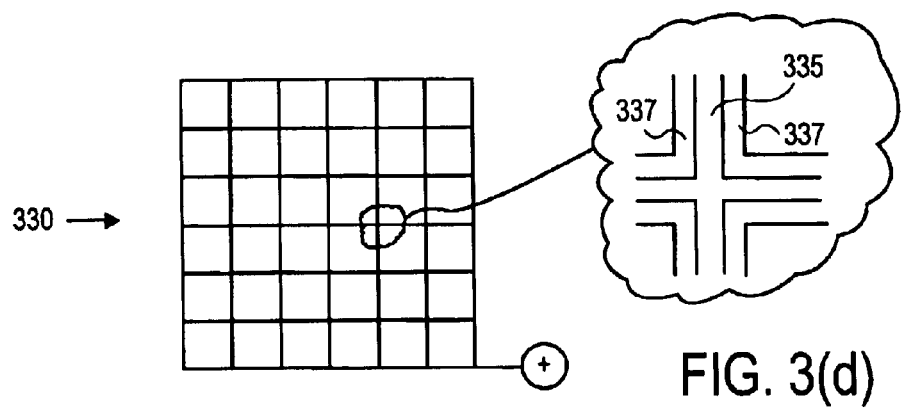

In one embodiment, the insulator array 320 in the electrostatic pellicle system 300 is located outside the active area 301 as shown in FIG. 3(c). By providing support and separating the discharge array 310 from the collection capture array 330 only around their peripheral regions, the exposure radiation 60 or 70 impinging on the active area 301 will not be obstructed. In one embodiment, each insulator array 310 may provide a separation of about 0.1–0.8 mm.

In another embodiment, the insulator array 320 in the electrostatic pellicle system 300 may include a grid of insulators. Thus, the grid of insulators is able to provide support and separate the wires 315 on the discharge array 310 from the wires 335 on the collection capture array 330. However, part of the exposure radiation 60 or 70 impinging on the active area 301 may then be obstructed.

A power supply 400, or a battery, may provide power to the electrostatic pellicle system 300 to charge the discharge array 310 and the collection capture array 330 with opposite polarity. In one embodiment, the power supply 400 charges the discharge array 310 negatively and the collection capture array 330 positively. The applied voltage should not result in any arcing or spark-over between wires 315 on the discharge array 310 and wires 335 on the collection capture array 330 in the electrostatic pellicle system 300.

A voltage differential of about 500.0–7,500.0 volts may be present in one embodiment. A direct current (DC) of about 15.0–150.0 nanoAmperes (nA) may be present in another embodiment. The voltage and current that may be present will depend on the geometry (such as cross-sectional area, length, and layout) and resistivity of the wires involved in the electrostatic pellicle system 300. The voltages and currents used in the electrostatic pellicle system 300 may be monitored and controlled through a control system 500 with appropriate characteristics, including a feedback loop having a sufficiently fast response time. The control system 500 may include a computer that interfaces with the stepper.

A contaminant 500 should be kept away from the vicinity of the transmissive mask 100 or reflective mask 1100 during exposure in a stepper to avoid degrading the mask, the wafer, or the photoresist on the wafer. The contaminant 500 may be in a solid phase (particulate), or a liquid phase, or a gaseous phase. The contaminant 500 may be organic or inorganic, acidic or basic, molecular or elemental, and metallic or ionic. A contaminant 500 that may be chemically active includes a chlorine ion, a sodium ion, an amine base, and a copper metal.

A purge may keep a contaminant 500 away from the vicinity of the transmissive mask 100 or reflective mask 1100 during exposure. The purge may include a flow of a gas. The flow may be parallel or perpendicular to the plane of the electrostatic pellicle system 300. The flow may be in a laminar or turbulent regime. The gas must be chemically inert and optically inactive when illuminated by the exposure radiation 60 or 70.

A contaminant 500 that is optically active may absorb the exposure radiation 60 or 70 and affect the dose during exposure in a stepper. Consequently, the concentration of the contaminant 500 must be reduced to 1.0 part per million (ppm) or less. A contaminant 500 that is optically active may include water, oxygen, carbon dioxide, and a wide variety of organic compounds, especially hydrocarbons. The concentration of a contaminant 500 that is optically active may be measured at the wavelength of the exposure radiation 60 or 70 using Tunable Diode Laser Absorption Spectroscopy (TDLAS). Calibration may be based on Beer's Law.

Some embodiments of a method to keep a contaminant 500 away from the vicinity of a transmissive mask 100 or reflective mask 1100 during exposure in a stepper, as claimed in the present invention, will be described next.

According to one embodiment of the present invention, electrostatic forces may be used to collect the contaminant 500 at a designated surface. The contaminant 500 should be collected at the surface in such a way as not to interfere with the exposure radiation 60 or 70. The contaminant 500 may include an uncharged or neutral particle 510, a positively-charged particle 520, or a negatively-charged particle 530 as shown in FIG. 2. The contaminant 500, whether charged or not, is subject to gravitational and aerodynamic forces. The gravitational force tends to be larger for a particle with a larger mass while the aerodynamic force tends to be larger for a particle with a larger size. Aerodynamic forces may be described in terms of viscous drag.

According to another embodiment of the present invention, electrostatic forces may be used to counteract and overcome some or all of the forces, including gravitational and aerodynamic forces, that are present to collect the contaminant 500 at the designated surface. The direction and magnitude of movement of the contaminant 500 depends on the vector sum of all the forces acting on the contaminant 500. By applying electrostatic forces with appropriate directions and sufficiently large magnitudes, a positively-charged particle 520 may be attracted to a negatively-charged surface while a negatively-charged particle 530 may be attracted to a positively-charged surface. An initially uncharged or neutral particle 510 may also respond to the electrostatic forces if a charge, either positive or negative, is first induced on the particle by an electric field.

The dominant form of electrostatic forces may be described in terms of Coulomb's law. Electrostatic forces may be provided by one or more electric fields. In one embodiment, an electric field strength may be about 6.0–85.0 volts/cm. In another embodiment, an electric field strength may be about 200.0–4,000.0 volts/cm. As needed, the electric field may be modulated so as to change the direction or magnitude of the associated electrostatic forces.

Electrostatic forces may also be provided by one or more magnetic fields. A magnetic field may arise from a permanent magnet or from an electromagnet. As needed, the electromagnet may be modulated so as to change the direction or magnitude of the associated electrostatic forces.

The total amount of the contaminant 500 deposited on the surface depends on the concentration of the contaminant 500 and the elapsed time. The contaminant 500 that has been attracted to the surface by electrostatic forces may be left on the surface temporarily or permanently.

According to still another embodiment of the present invention, aerodynamic forces may be applied along with the electrostatic forces to remove or keep the contaminant 500 away from the vicinity of the transmissive mask 100 or reflective mask 1100. Aerodynamic forces may be provided in the form of a purge. The purge may include a flow of a chemically inert and optically inactive gas. The flow may be parallel or perpendicular to the plane of the transmissive mask 100 or reflective mask 1100. The flow may be in a laminar or turbulent regime.

In a further embodiment, the polarity of the electrostatic forces may be reversed over time so that the purge, such as the gas flow, may remove the contaminant 500 from the surface. Any reversal of polarity may occur as frequently or as quickly as needed. Reversing the polarity of an electrostatic force may be done by reversing the polarity of the corresponding electric field.

In one embodiment of the method claimed by the present invention, electrostatic forces may be provided by an electrostatic pellicle system 300 in a transmissive mask assembly 50 or a reflective mask assembly 1050. An elevation view of an embodiment of an electrostatic pellicle system 300 of a transmissive mask assembly 50 of the present invention is shown in FIG. 2. An electric field may be provided by a power supply 400 or a battery coupled to the transmissive mask assembly 50 or reflective mask assembly 1050. A positively-charged particle 520 may be attracted by a discharge array 310 that has been negatively-charged. A negatively-charged particle 530 may be attracted by a collection capture array 330 that has been positively-charged. The contaminant 500 may be removed from the electrostatic pellicle system 300 during exposure or after exposure has been completed in a stepper. After being removed from the surface, the contaminant 500 may be transported by the flow of a purge gas out of the optical path of the exposure radiation 60 or 70.

Many alternative embodiments and numerous particular details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, and so forth that have been described herein. It is to be understood that the detailed description of the present invention should be taken as illustrative and not limiting, wherein the scope of the present invention should be determined by the claims that follow.

Thus, we have described an apparatus for and a method of keeping contamination away from the vicinity of a mask during exposure.

What is claimed is:

1. A method of keeping contaminants away from a vicinity of a mask during exposure, said contaminants including an uncharged or neutral particle, a positively-charged particle, or a negatively-charged particle, comprising:

inducing a positive or negative charge on the uncharged or neutral particle;

attracting the positively-charged particle with a negatively-charged electric field; and attracting the negatively-charged particle with a positively-charged electric field.

2. The method of claim 1 further comprising reversing polarity of said electric fields over time.

3. The method of claim 2 further comprising purging the vicinity of the mask.

4. The method of claim 3 further comprising transporting contaminants away from the mask.

* * * * *